(12) United States Patent
Yoo

(10) Patent No.: US 8,198,679 B2
(45) Date of Patent: Jun. 12, 2012

(54) HIGH VOLTAGE NMOS WITH LOW ON RESISTANCE AND ASSOCIATED METHODS OF MAKING

(75) Inventor: Ji-Hyoung Yoo, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 125 days.

(21) Appl. No.: 12/474,045

(22) Filed: May 28, 2009

(65) Prior Publication Data

US 2010/0301414 A1    Dec. 2, 2010

(51) Int. Cl.
*H01L 29/72* (2006.01)

(52) U.S. Cl. .................... 257/343; 257/E29.256

(58) Field of Classification Search .................. 257/335, 257/343, E21.417, E29.256; 438/286, 307
See application file for complete search history.

(56) References Cited

U.S. PATENT DOCUMENTS

| 6,048,772 A * | 4/2000 | D'Anna ................ 438/301 |
| 2008/0023785 A1 * | 1/2008 | Hebert ................ 257/492 |

* cited by examiner

*Primary Examiner* — Thomas L Dickey
(74) *Attorney, Agent, or Firm* — Perkins Coie LLP

(57) ABSTRACT

High voltage NMOS devices with low on resistance and associated methods of making are disclosed herein. In one embodiment, a method for making N typed MOSFET devices includes forming an N-well and a P-well with twin well process, forming field oxide, forming gate comprising an oxide layer and a conducting layer, forming a P-base in the P-well, the P-base being self-aligned to the gate, side diffusing the P-base to contact the N-well, and forming N+ source pickup region and N+ drain pickup region.

5 Claims, 7 Drawing Sheets

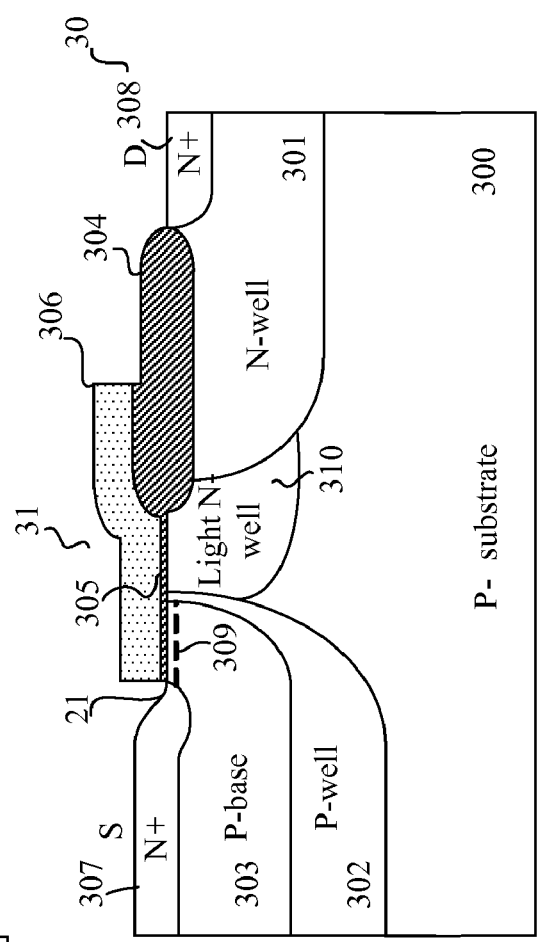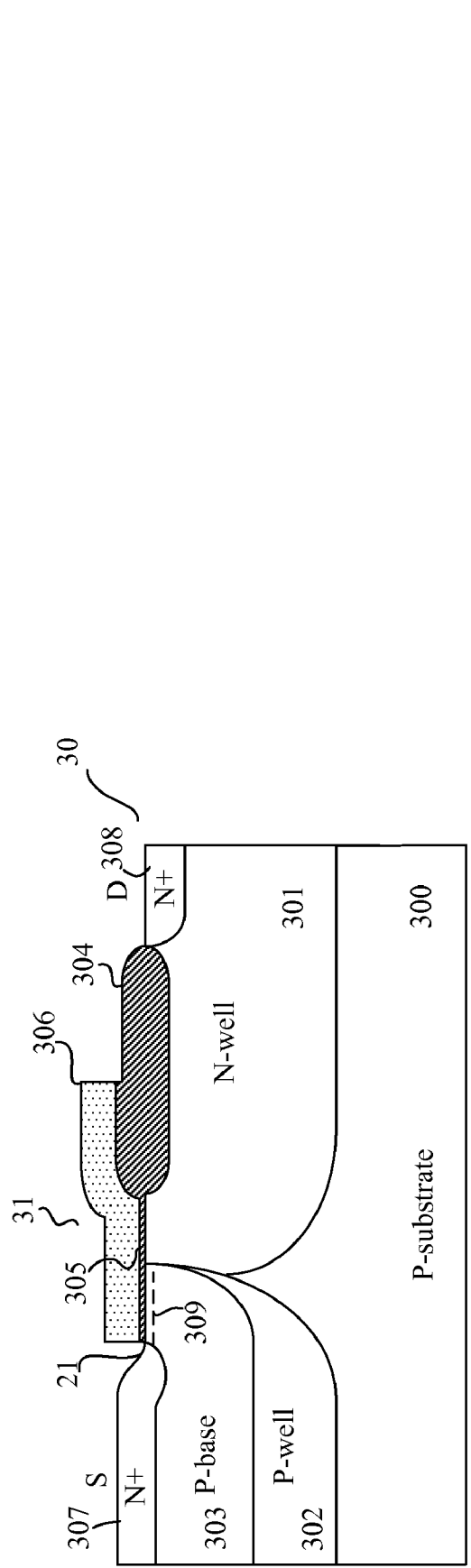

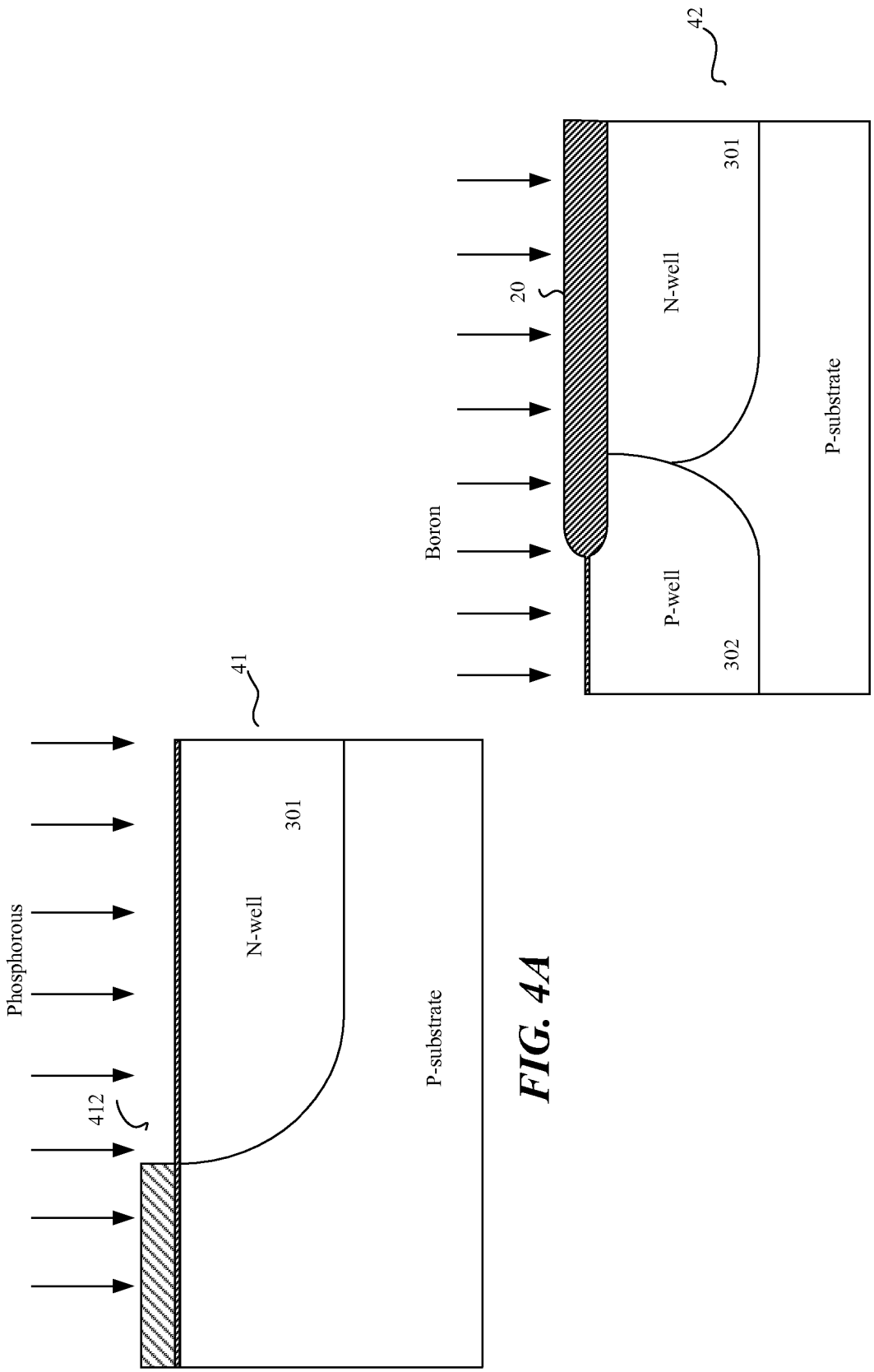

US 8,198,679 B2

HIGH VOLTAGE NMOS WITH LOW ON RESISTANCE AND ASSOCIATED METHODS OF MAKING

TECHNICAL FIELD

The present disclosure relates to high voltage metal-oxide-semiconductor field-effect transistor (MOSFET) devices, and more particularly, to n-channel MOSFET (NMOS) devices with low on resistance and high breakdown voltage.

BACKGROUND

For High Voltage (HV) NMOS fabricated with BiCMOS or BCDMOS technologies, low on resistance (Ron) and high breakdown voltage are two essential parameters. FIG. 1 illustrates one conventional HV NMOS structure, and FIGS. 2A and 2B show stages in forming the HV NMOS structure of FIG. 1. As shown in FIG. 1, The HV NMOS comprises an N-well and a P-well both implanted in a P-substrate. The NMOS includes a gate G composed of an oxide layer 11 and a poly-silicon layer 12, an N+ source pickup region S, and a drain pickup region D. For the conventional HV NMOS, the P-well is defined by N-well oxidation 20 and is side diffused under the N-well oxide 20 seen in FIG. 2A. An oxidation silicon step 21 is formed on the main surface after the N-well oxide 20 is removed as seen in FIG. 2B. In conventional devices, the channel length (P-well overlap with Poly) tends to be long in order to increase the mask misalignment margin and punch-through breakdown voltage.

The channel for conventional NMOS as seen in FIG. 1 is defined by the overlap portion of the P-well area and its side diffusion area with the gate electrode 12. Thus, the portion of the channel under the silicon step 21 is not flat, as indicated by the dotted line. The silicon step 21 is believed to hamper the electron flow along the channel to increase Ron. Also, the long channel further increases Ron.

BRIEF DESCRIPTION OF THE DRAWINGS

FIGS. 3A and 3B are schematic cross-sectional views of a HV NMOS with short channel length in accordance with embodiments of the disclosure.

FIGS. 4A, 4B, 4C, 4D, 4E, 4F, and 4G are schematic cross-sectional views of the HV NMOS in FIG. 3A during certain manufacturing stages in accordance with embodiments of the disclosure.

DETAILED DESCRIPTION

Figure 1:
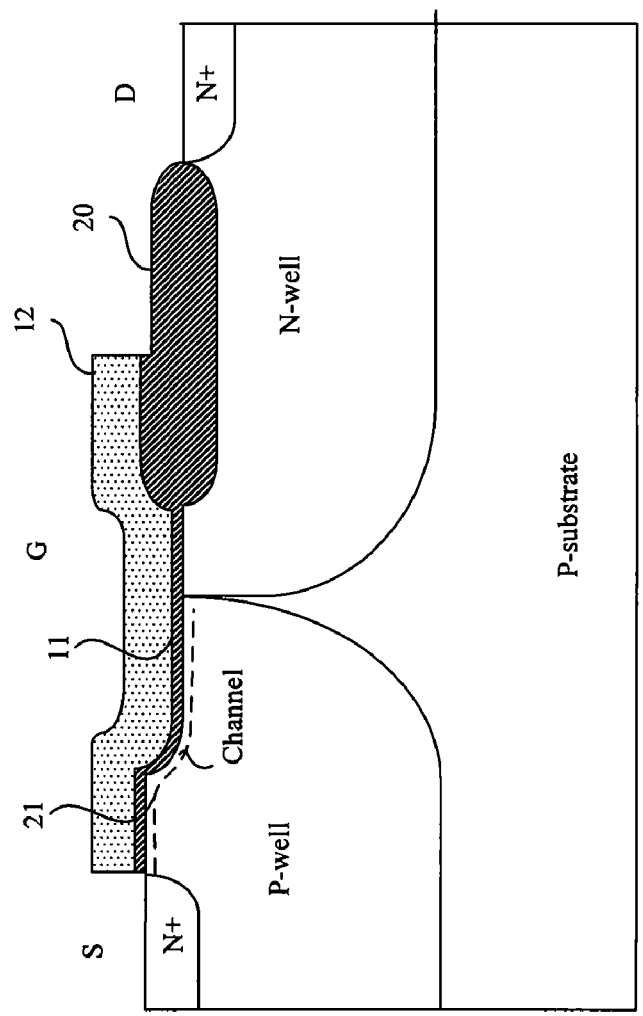
FIG. 1 is a schematic cross-sectional view of a HV NMOS in accordance with the prior art.
Figure 2B:
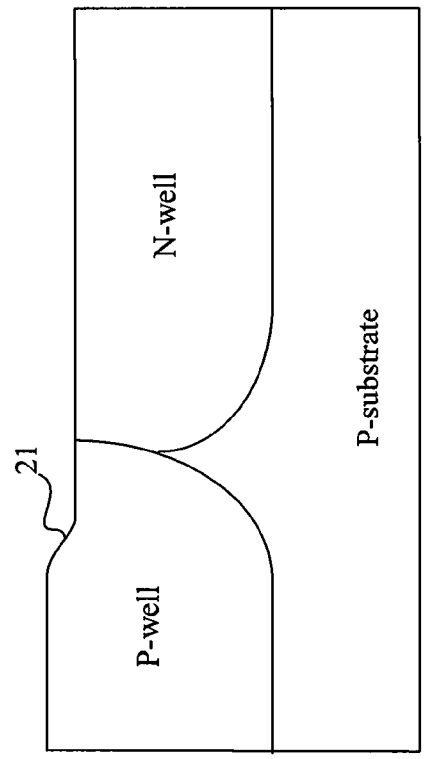
FIG. 2B is a schematic cross-sectional view of a portion of the HV NMOS during another manufacturing stage in accordance with the prior art.
Figure 2A:
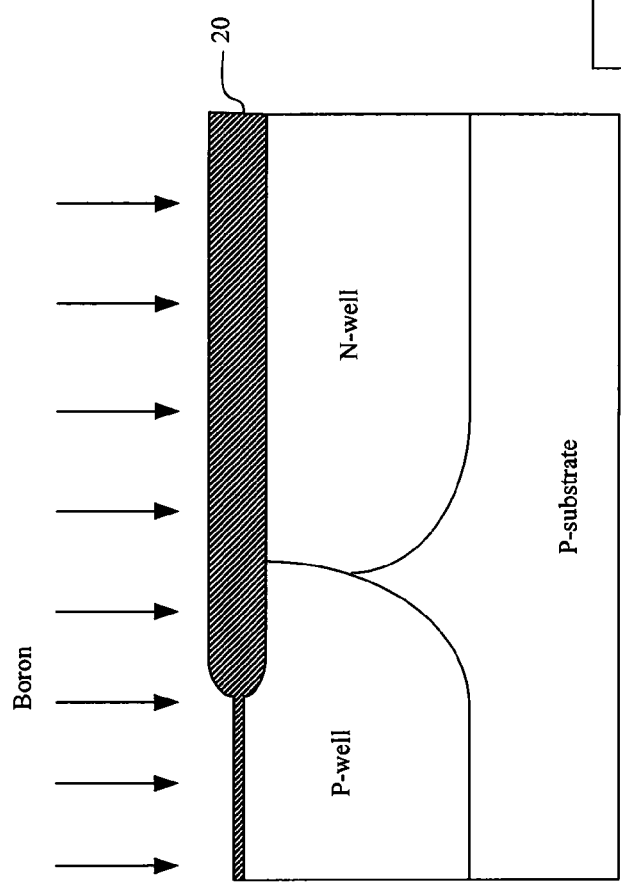
FIG. 2A is a schematic cross-sectional view of a portion of the HV NMOS during a manufacturing stage in accordance with the prior art.

Various embodiments of high voltage NMOS devices and associated methods of making are described below. Even though the processes are described with reference to processing semiconductor wafers, the processes can be used on other substrates upon which and/or in which microelectronic devices, micromechanical devices, data storage elements, optics, read/write components, and other features are fabricated. For example, SRAM, DRAM (e.g., DDR/SDRAM), flash memory (e.g., NAND flash memory), processors, imagers, and other types of devices can be constructed on semiconductor wafers or other substrates. Moreover, several other embodiments of the devices and/or processes can have different configurations, components, or procedures than those described in this section. A person skilled in the relevant art will also understand that the systems and/or methods disclosed herein may have additional embodiments and that the systems and methods disclosed herein may be practiced without several details of the embodiments described below with reference to FIG. 3A-5.

FIG. 3A illustrates an HV NMOS 30 with a short gate 31 not surpassing the silicon step 21 in accordance with embodiments of the disclosure. In the illustrated embodiment, the HV NMOS 30 is fabricated on a P-substrate 300. From the main surface, at the drain region D, an N-well 301 is implanted into the P-substrate 300. The N-well 301 can further include at least two levels of concentration. For example, the N-well 301 can include a lighter concentration region 310 (Light N-well) and a higher concentration region 301 (N-well) as seen in FIG. 3B.

Referring back to FIG. 3A, an N-well oxidation is taken out after forming the N-well thus leaving a silicon step 21 after removing the N-well oxide. And at the source region S, a P-well 302 is implanted from the main surface into the P-substrate 300 self-aligned to the N-well oxide and side diffused into the N-well 301. The P-well 302 acts as a supporting body with a lighter concentration. And a P-base 303 is implanted from the main surface into the P-well 302 with a higher concentration than P-well 302 and is self aligned to the edge of the gate 31 and side diffused to meet the edge of the P-well 302 as the main body. The P-base 303 has a lower depth than P-well 302. On the surface of the N-well, a field oxide 304 is formed. The gate 31 is formed outside of the silicon step 21. The gate 31 is above the side diffusion region of P-base 303, the N-well 301 drift region and overlays part of the field oxide 304.

The gate 31 is composed of an internal oxide layer 305 and an external conducting layer 306 (e.g., a polysilicon layer). N+ source pickup region 307 and N+ drain pickup region 308 are implanted in P-base 303 and N-well 301, respectively, and are aligned to the edge of the gate 31 and the field oxide 304, respectively. The length of the N-well 301 region in FIG. 3A or the Light N-well 310 region in FIG. 3B from the edge of the channel 309 to N+ pickup region 308 defines the drift length which is believed to affect the device breakdown voltage and Ron. Without being bound by theory, it is believed that the longer the drift region, the higher the breakdown voltage and the Ron. Also, it is believed that the dopant concentration of the drift region affects the breakdown voltage and Ron. The higher the concentration, the lower the breakdown voltage and the Ron.

With a given breakdown voltage, lower Ron is desired, so breakdown voltage and Ron are conflicting parameters with a trade-off relationship. As shown in FIG. 3A, by shortening the gate 31 not surpassing (or overlapping) the silicon step 21, the HV NMOS 30 has a flat and shorter channel 309 which lowers Ron. To prevent the punch-through breakdown with the short channel, the HV NMOS 30 includes the P-base 303 as a main body. P-base 303 is implanted after and self-aligned to the gate 31 and then is driven to side diffuse under the gate 31 to meet the P-well 302 edge. P-base 303 has a higher concentration and shallower junction than P-well 302 and the channel 309 is formed by side-diffused P-base 303. Since P-base 303 has a shallow junction, P-base to N-well breakdown voltage is not high enough in the high operating voltage applications. Thus, P-well is used as a supporting body. The structure of P-base 303 as the main body and P-well 302 as the supporting body is believed to boost the breakdown voltage while keeping a short channel 309.

Figure 4D:
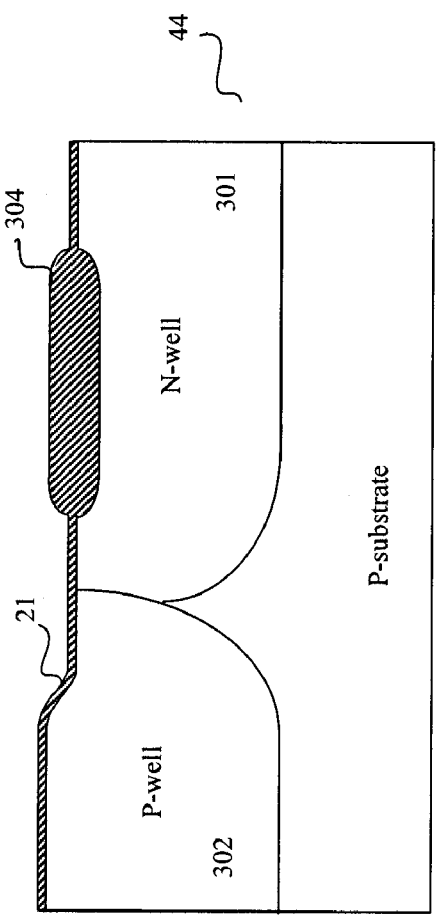

FIGS. 4A-4G illustrate a process flow of the HV NMOS 30 in FIG. 3A in accordance with embodiments of the disclosure. In stage 41 as illustrated in FIG. 4A, with a patterned mask, an N-well window is opened by etching the nitride layer 412 and phosphorous or arsenic is implanted to form the N-well 301. In stage 42 as illustrated in FIG. 4B, an N-well oxidation is performed and an N-well oxide 20 is grown in the N-well window. Then, the nitride layer 412 is removed and the remaining N-well oxide 20 serves as the blocking mask for the P-well 302. Boron or other P-type substance is implanted and self-aligned to the edge of the N-well oxide 20. The P-well 302 is formed to side diffuse under the N-well oxide 20 to the N-well 301.

Figure 4C:
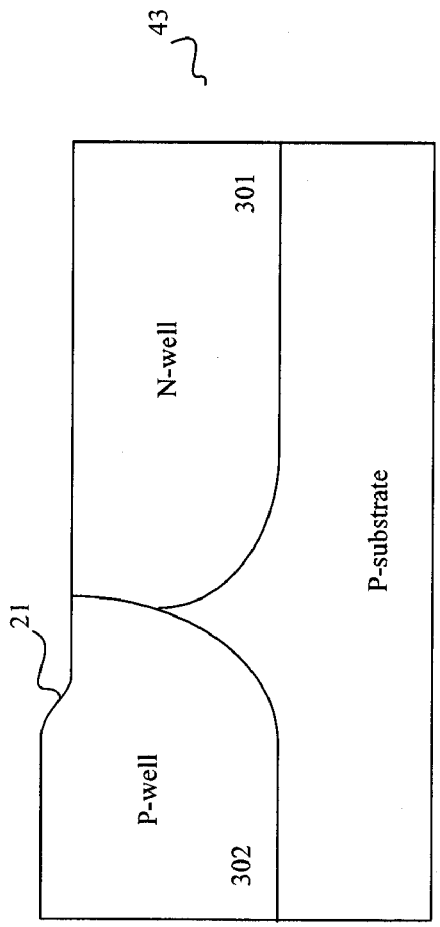

In stage 43 as illustrated in FIG. 4C, the oxide is removed, leaving the silicon step 21. In stage 44 as illustrated in FIG. 4D, a pad oxide is grown on the surface and then nitride is deposited on the pad oxide. An etch stage is used with an active mask to pattern the nitride layer to open a window. Then, P-type field implant masking stages can be performed, and then oxidation is performed in the window to form the field oxide 304 serving as a field isolation region.

Figure 4E:
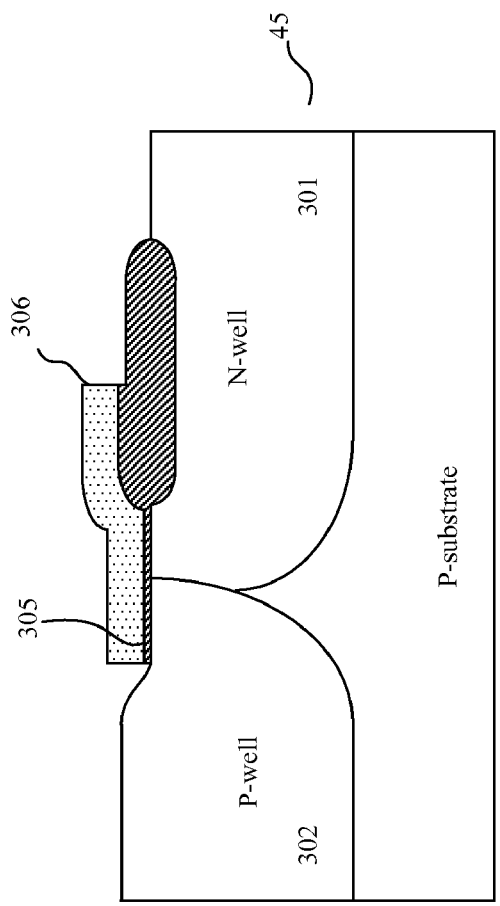

After the field oxidation, the nitride layer is removed. In stage 45 as illustrated in FIG. 4E, the gate is formed. Initially, the gate oxide 305 is formed; then, conductor layer 306 (typically polysilicon) is deposited on the gate oxide 305. The gate is patterned with a mask to form the desired shape of the gate electrode. The gate does not surpass or overlap with the N-well silicon stage 21. Since the gate does not cover the N-well silicon stage 21, the channel is flat which ensures a smooth electron flow to decrease Ron. In addition, the overlap length of the gate and the P-well is short.

Figure 4F:
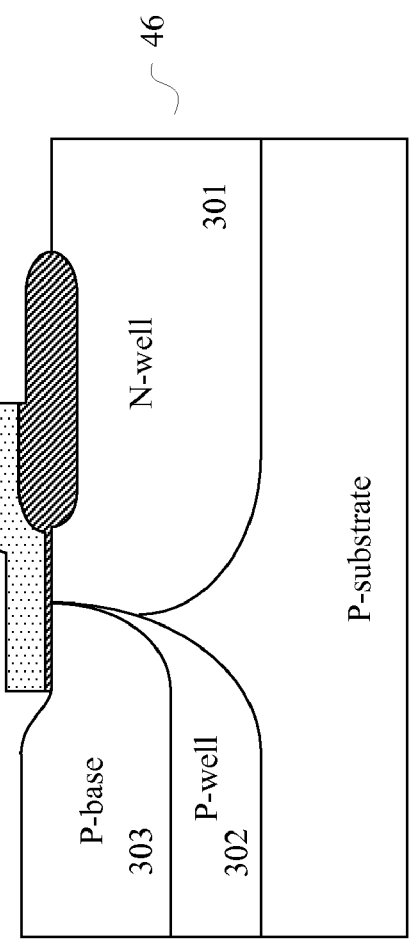
Figure 4G:
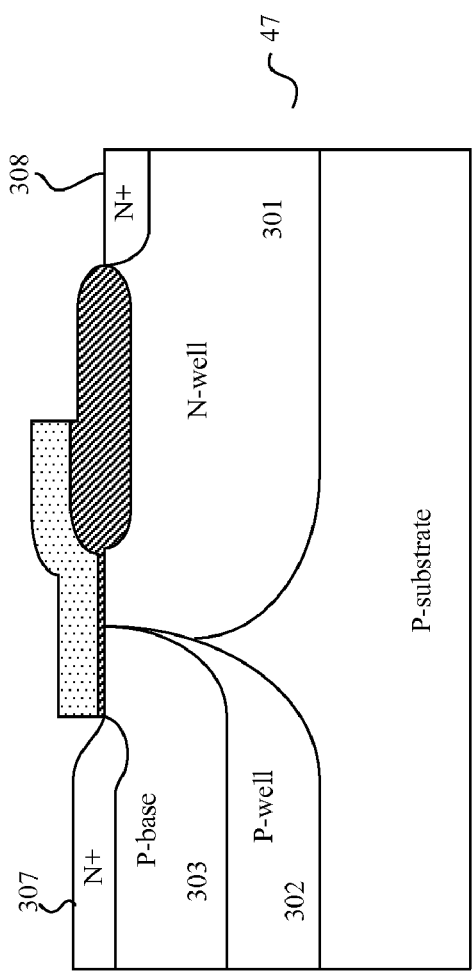

In stage 46 as illustrated in FIG. 4F, P-base 303 is formed by implanting boron into the P-well area and self-aligned to the gate. Then, the boron is driven by high temperature process to side diffuse to meet the edge of the P-well. P-base 303 is used as the main body to highlight the punch-through voltage and is shallower than P-well 302. When only P-base is used, it may be hard to handle the high operating voltage. Thus, the P-well with a deeper junction serves as a supporting body and may be used to improve the breakdown voltage. In stage 47 as illustrated in FIG. 4G, N+ source pickup region 307 and drain pickup region 308 are formed by arsenic diffusion and are self-aligned to the gate and the field oxide, respectively.

Figure 5:
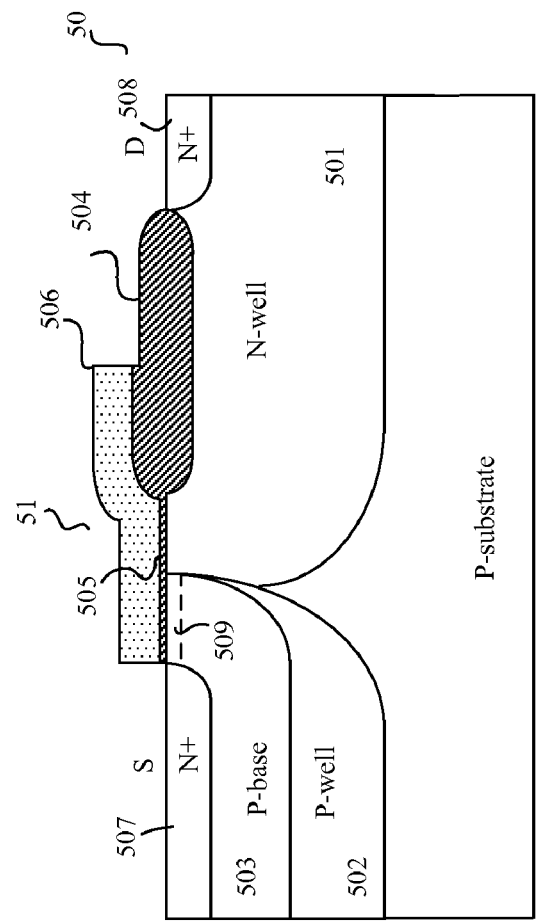
FIG. 5 is a schematic cross-sectional view of a HV NMOS in accordance with additional embodiments of the disclosure.

FIG. 5 illustrates another NMOS 50 without a silicon step in accordance with embodiments of the disclosure. In the illustrated embodiment, a N-well 501 and a P-well 502 are fabricated with a twin-well process in which each well is formed using its own mask without an N-well oxidation process. After implanting the N-well and the P-well, they are diffused with one thermal stage. Thus, there is no silicon step on the main surface which benefits the low Ron.

The remaining portion of the NMOS 50 can be generally similar to those of the NMOS 30 shown in FIG. 3A or FIG. 3B. Thus, the NMOS 50 comprises the N-well 501 and P-well 502 implanted in the P-substrate, a P-base 503 implanted in the P-well 502, a gate 51 composed of the oxide layer 505 and conducting layer 506 with a short channel 509. The NMOS 50 further comprises an N+ source pickup region 507, an N+ drain pickup region 508 and a field oxide 504. The process flow of NMOS 50 can be the same in stage 44-47 for forming the NMOS 30 of FIG. 3 except before stage 44 as shown in FIG. 4D, the N-well 501 is formed with a mask and the P-well 502 is formed with another mask. Also, it takes a two well drive-in process. No N-well oxidation is performed, thus no silicon step is left.

In certain embodiments, the N type regions can optionally adopt phosphorous, arsenic, or antimony. Or the P-type regions optionally adopt the other elements in the same family such as aluminum or gallium. In other embodiments, the N-type MOSFET as described above can be used in 100-200 high voltage operation applications. In further embodiments, the NMOS with structure described above can be used in medium voltage applications such as 20-100 V.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A MOSFET device, comprising: a substrate having a surface; a drain region in the substrate proximate the surface, the drain region having a drain well and a drain pickup region of a first doping type; a source region in the substrate proximate the surface and laterally spaced apart from the drain region, the source region having a source well and a source base of a second doping type and a source pickup region of the first doping type, the source base being located in the source well with the source base laterally contacting the drain well; and a gate on the surface of the substrate, the gate having an oxide layer and a conductive layer overlapping with the source base and the drain well, wherein one end of the source pickup region is laterally aligned with an edge of the gate, wherein the first doping type is N-type; the second doping type is P-type; the drain well is an N-well; the source well is a P-well having a first dopant concentration; and the source base is a P-base having a second dopant concentration higher than the first dopant concentration, and wherein the surface has a silicon step and the gate does not overlap the silicon step.

2. The MOSFET of claim 1 wherein the P-well contacts the N-well.

3. The MOSFET of claim 2 wherein the P-base contacts an edge of the P-well.

4. The MOSFET of claim 3 wherein the gate is over a side diffusion part of the P-well and a part of the N-well.

5. A MOSFET device, comprising:
a substrate having a surface;
a drain region in the substrate, the drain region having a drain well and a drain pickup region of a first doping type;
a source region in the substrate, the source region having a source well and a source base of a second doping type, the source base being located in the source well with the source base contacting the drain well; and
a gate on the surface of the substrate, the gate having an oxide layer and a conductive layer overlapping with the source base and the drain well wherein:
the first doping type is N-type;
the second doping type is P-type;
the drain well is an N-well;
the source well is a P-well; and
the source base is a P-base; and
the N-well has at least two levels of concentration.

* * * * *